United States Patent
Yamana

[11] Patent Number: 5,618,470
[45] Date of Patent: Apr. 8, 1997

[54] ELECTRICALLY CONDUCTIVE PASTE

[75] Inventor: Tsuyoshi Yamana, Kyoto, Japan

[73] Assignee: Murata Manufacturing Co., Ltd., Japan

[21] Appl. No.: 591,230

[22] Filed: Jan. 18, 1996

[30] Foreign Application Priority Data

Jan. 23, 1995 [JP] Japan ................................. 7-008407

[51] Int. Cl.$^6$ .......................... H01B 1/02; B32B 15/04
[52] U.S. Cl. ....................... 252/512; 252/518; 427/216; 427/220; 106/1.13; 428/357; 428/922
[58] Field of Search .................. 252/512, 518; 427/216, 220; 106/1.13; 428/357, 922

[56] References Cited

U.S. PATENT DOCUMENTS

| | | | |
|---|---|---|---|
| 5,332,596 | 7/1994 | Tani et al. | 427/216 |
| 5,344,503 | 9/1994 | Watanabe et al. | 148/248 |

FOREIGN PATENT DOCUMENTS

| | | |
|---|---|---|
| 3176904 | 7/1991 | Japan . |
| 4146972 | 5/1992 | Japan . |
| 0195005 | 8/1993 | Japan . |

*Primary Examiner*—Paul Lieberman
*Assistant Examiner*—M. Kopec
*Attorney, Agent, or Firm*—Ostrolenk, Faber, Gerb & Soffen, LLP

[57] ABSTRACT

An electrically conductive paste effectively protects copper powder from oxidation and provides good solderability and terminal strength. It is composed of a copper powder, a glass frit in an amount of 2–20 wt % of the copper powder, an organic vehicle in an amount of 10–30 wt % of the solid component (the copper powder and glass frit), and a solution of a borate ester having a high boiling point, a solution of boric acid, a solution of an organic salt of boron, and a solution of a borate ester having a low boiling point in an alcohol having a high boiling point, the amount of the solution being 0.01 to 0.5 wt % in terms of boron and based on the copper powder.

14 Claims, 1 Drawing Sheet

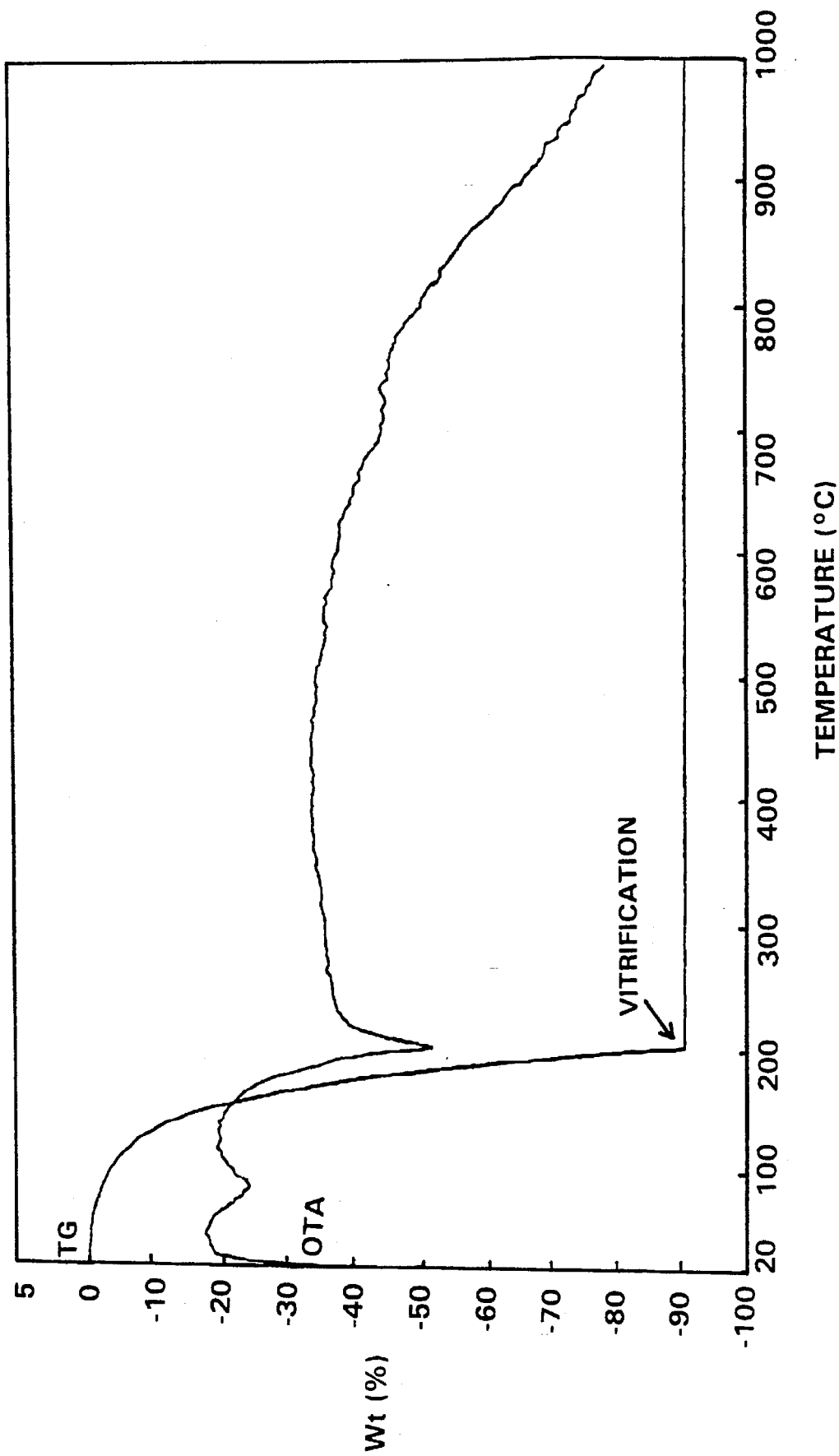

ELECTRICALLY CONDUCTIVE PASTE

BACKGROUND OF THE INVENTION

1. Field of the Invention

The present invention relates to an electrically conductive paste containing a copper powder subjected to anti-oxidizing treatment.

2. Description of the Prior Art

A copper-based electrically conductive paste is conventionally prepared by dispersing a copper powder (as the conductor) and a glass frit into an organic vehicle. Such a copper-based electrically conductive paste is used to form external electrodes on chip-type laminated ceramic capacitors and to form circuit patterns on ceramic substrates. To form external electrodes and circuit patterns, the electrically conductive paste is applied to a substrate by coating or printing, and after drying, the paste is baked in a non-oxidizing atmosphere (such as nitrogen) or a slightly oxidizing atmosphere containing a small amount of oxygen (less than 1000 ppm).

What is required of an electrically conductive paste of this type is that the copper powder contained therein should be protected from oxidation because oxidized copper powder adversely effects the printing performance of the paste, increases the resistivity of the resulting electrodes and circuits, and renders the resulting electrodes and circuits poor in solderability. A common practice to prevent such troubles is to subject the copper powder to anti-oxidizing pretreatment. This treatment is accomplished typically by dipping copper powder in a solution containing boric acid with stirring and mixing, followed by filtration and heating at 50°–260° C. so that a film of boric acid is formed on the surface of the copper powder. The solvent of the boric acid-containing solution is an alcohol (typically methanol).

The conventional anti-oxidizing method mentioned above has a problem. Specifically, in the case where a solution containing boric acid is prepared using an alcohol which dissolves boric acid very well, a volatile ester is formed. This results in vaporization of boric acid during stirring, mixing, and heating.

Japanese Patent Laid-open Publication No. 5-195005 discloses a method to address this problem. According to this method, copper powder, boric acid, and a solvent are mixed together, and the solvent is then evaporated from the mixture by a drying process. The mixture contains 0.01 to 0.1 wt % of boric acid. (calculated in terms of boron) of the combined weight of the boric acid and copper powder to be treated. The mixture also contains a sufficient amount of either ketone or hydrocarbon as the solvent in order to dissolve the boric acid completely. However, the disclosed method is complicated and requiring a long process time, which results in a high production cost.

SUMMARY OF THE INVENTION

The present invention can solve the above-mentioned problems and provide an electrically conductive paste which has good resistance to oxidation and is prepared by a simple and inexpensive process.

An electrically conductive paste of the present invention includes a copper powder, a glass frit, an organic vehicle, and a solution selected from the group consisting of a solution of borate ester, a solution of boric acid, and a solution of an organic salt of boron.

BRIEF DESCRIPTION OF THE DRAWING(S)

FIG. 1 is a plot of TG (thermogravimetry) and DTA (differential thermal analysis) of tributyl borate.

DETAILED DESCRIPTION OF THE INVENTION

The first aspect of the present invention resides in an improved electrically conductive paste including a copper powder, a glass frit, and an organic vehicle, wherein the electrically conductive paste further includes a solution selected the group consisting of a solution of borate ester, a solution of boric acid, and a solution of an organic salt of boron.

The second aspect of the present invention resides in the electrically conductive paste as defined in the first aspect, wherein the solution of borate ester is a solution of a borate ester having a high boiling point or a solution of a borate ester having a low boiling point in an alcohol having a high boiling point. In this specification, a high boiling point is 220° C. or more and a low boiling point is less than 220° C.

The third aspect of the present invention resides in the electrically conductive paste as defined in the second aspect, wherein the borate ester having a high boiling point is one which is represented by the formula $(C_nH_{2n+1}O)_3B$, where $n \geq 4$.

The fourth aspect of the present invention resides in the electrically conductive paste as defined in the second aspect, wherein the borate ester having a low boiling point is a lower alkyl $(C_{1-5})$ ester compound selected from the group consisting of methyl borate, trimethyl borate, triethyl borate and tripropyl borate.

The fifth aspect of the present invention resides in the electrically conductive paste as defined in the first aspect, wherein the organic salt of boron is selected from the group consisting of triethyl boron, dimethylamine borane and sodium borohydride.

The sixth aspect of the present invention resides in the electrically conductive paste as defined in the first aspect, wherein the solution of borate ester, boric acid, or organic salt of boron contains an amount of about 0.01 to 0.5 wt % based on the atomic weight of boron and the copper powder is about 99.9 to 99.5 wt % of the combination.

The seventh aspect of the present invention resides in the electrically conductive paste as defined in the first aspect, wherein the paste includes from about 70 to 90 wt % of a solid component and from about 10 to 30 wt % of an organic vehicle, and the solid component comprises copper powder and glass frit in a ratio of from about 80:20 to 98:2 by weight.

According to the present invention, the electrically conductive paste contains a solution of borate ester, boric acid, organic salt of boron or combination thereof, and the amount of the solution is about 0.01 to 0.5 wt % calculated based on the atomic weight of boron based on the total weight of the solution and copper, i.e. the copper powder is about 99.5 to 99.99 wt %. Stated alternatively, the solution is about 0.01–0.5 parts (as boron) per hundred parts of copper. An adequate amount should be established so that the electrically conductive paste has good workability and printing performance.

The amount of the solution should be greater than 0.01 wt % so that the electrically conductive paste is protected from oxidation and from becoming poor in solderability. Also, the amount of the solution should be less than 0.5 wt % so that the electrically conductive paste has good solderability and provides high terminal strength.

The electrically conductive paste should contain solid components composed of about 2–20 wt % glass frit and about 80–98 wt % copper powder. The amount of glass frit should be greater than about 2 wt % so that the electrically conductive paste has good adhesion to the dielectric ceramic body after baking. Also, the amount of glass frit should be less than about 20 wt % so that the electrically conductive paste has an adequate conductivity and dielectric loss and provides an adequate capacity. The copper powder should preferably be one which has a particle diameter in the range of about 0.1 to 10 μm as measured by SEM. A coarser copper powder is not desirable because it is not completely sintered.

The electrically conductive paste is composed of about 90–70 wt % solid component (copper powder plus glass frit) and about 10–30 wt % of inert organic vehicle. A conventional organic vehicle is, for example, ethyl cellulose dissolved in terpineol.

The electrically conductive paste of the present invention can be prepared without the conventional process for protecting copper powder from oxidation, which consists of "dissolving boric acid in a solvent (such as ketone solvent, hydrocarbon solvent, and aromatic solvent), dipping with stirring a copper powder in the solution of boric acid, and drying the treated copper powder for solvent evaporation" as disclosed in Japanese Patent Laid-open Publication No. 5-195005. This greatly contributes to cost reduction. In addition, according to the present invention, it is possible to use a borate ester having a low boiling point satisfactorily after dissolution in an alcohol having a high boiling point.

EXAMPLES

The invention will be described in more detail with reference to the following examples.

The electrically conductive paste of the present invention is composed of a copper powder, a glass frit, and an organic vehicle, and the copper powder is protected from oxidation by incorporating boron in the paste in the form of solution of borate ester, boric acid, or organic salt of boron. The amount of boron is about 0.01 to 0.5 weight parts for 100 weight parts of copper powder. The borate ester may have a high boiling point or a low boiling point. For example, tributyl borate has a high boiling point and methyl borate has a low boiling point. In the case of a borate ester having a low boiling point, the borate ester is preferably dissolved in an alcohol having a high boiling point so as to lower its volatility.

The electrically conductive paste of the present invention is prepared by the following method. First, 80 g of copper powder having a particle diameter of 1–5 μm, 7 g of glass frit made of $B_2O_3$-PbO-ZnO glass, 13 g of an organic vehicle consisting of ethyl cellulose which is dissolved in α-terpineol, and a solution of borate ester or boric acid which contains boron in an amount of 0.006–0.6 wt % calculated based on the atomic weight of boron and the combined weight of the boron and copper powder are combined. The organic vehicle can be alternatively prepared by dissolving methyl cellulose, butyl cellulose, or acrylic resin in α-terpineol. Then these materials are thoroughly mixed together by a three-roll mill, thereby obtaining a electrically conductive paste of the invention. The electrically conducive paste contains about 87 wt % of solid component and about 13 wt % of organic vehicle, with the former being composed of about 92.0 wt % of copper powder and about 8.0 wt % of glass frit.

During this mixing process, each particle of the copper powder is uniformly coated with the solution of borate ester or boric acid. Since the present invention employs a liquid material including boron, the boron is evenly dispersed in the paste, even though the amount of the liquid material is very small. Further, a specific process for coating particles of the copper powder with the liquid material is not required.

In the case where the viscosity of the resulting paste should be adjusted for a specific application, a plurality of organic vehicles having different viscosities can be prepared and mixed so that the paste has a desired viscosity.

The thus obtained electrically conductive paste was applied by printing to an alumina substrate. After drying at 150° C. for 10 minutes, the printed paste was baked for 60 minutes, during which the temperature was raised to 600° C. and kept at this temperature for 10 minutes, with the rate of temperature rise and fall being the same. The baking was carried out in a slightly oxidizing atmosphere containing oxygen at 100–900 ppm.

The baked paste electrode was tested for solderability and terminal strength. The results are shown in Table 1. Solderability was evaluated by visually observing the alumina substrate after dipping in a solder bath with rosin flux. Terminal strength was evaluated by measuring the force required to peel the electrode from the alumina substrate when a lead wire (0.6 mm in diameter) soldered to the electrode was pulled at a rate of 100 mm/min. Solderability was rated as "good" for the soldered area greater than 90%, as "fair" for the soldered area of 50–90%, and as "poor" for the soldered area smaller than 50%. Tensile strength was rated as "good" for 1 kgf and above, as "fair" for 1 to 0.5 kgf, and as "poor" for 0.5 kgf or below. Those samples which are not conform to the present invention are indicated by marking with an asterisk.

TABLE 1

| Sample No. | Borate ester | Amount of boron (wt %) | Solderability | Terminal strength |
| --- | --- | --- | --- | --- |
| 1* | Tributyl borate | 0.006 | poor | fair |
| 2 | Tributyl borate | 0.010 | fair | fair |
| 3 | Tributyl borate | 0.100 | good | good |
| 4 | Tributyl borate | 0.200 | good | good |
| 5 | Tributyl borate | 0.300 | good | good |
| 6 | Tributyl borate | 0.400 | good | good |
| 7 | Tributyl borate | 0.500 | fair | fair |
| 8* | Tributyl borate | 0.600 | poor | poor |
| 9* | Methyl borate + terpineol (1:1) | 0.006 | poor | fair |
| 10 | Methyl borate + terpineol (1:1) | 0.010 | fair | fair |
| 11 | Methyl borate + terpineol (1:1) | 0.250 | good | good |
| 12 | Methyl borate + terpineol (1:1) | 0.500 | fair | fair |

TABLE 1-continued

| Sample No. | Borate ester | Amount of boron (wt %) | Solderability | Terminal strength |
| --- | --- | --- | --- | --- |
| 13* | Methyl borate + terpineol (1:1) | 0.600 | poor | poor |
| 14* | Boric acid | 0.006 | poor | fair |
| 15 | Boric acid | 0.010 | fair | fair |
| 16 | Boric acid | 0.100 | good | good |
| 17 | Boric acid | 0.200 | good | good |
| 18 | Boric acid | 0.300 | good | good |
| 19 | Boric acid | 0.400 | good | good |
| 20 | Boric acid | 0.500 | fair | fair |
| 21* | Boric acid | 0.600 | poor | poor |
| 22* | Methyl borate | 0.010 | poor | poor |
| 23* | Methyl borate | 0.250 | poor | poor |
| 24* | Methyl borate | 0.600 | poor | poor |

It is apparent from Table 1 that the samples conforming to the present invention have good solderability and terminal strength.

It is noted that Samples Nos. 2 to 7, which employ tributyl borate (boiling point of 228°–229° C.) provide good solderability and terminal strength because of the low volatility of tributyl borate. Similar results were obtained with Samples Nos. 15 to 2 which employ boric acid.

By contrast, it is noted that Samples Nos. 22 to 24, which employ alkyl borate $(C_nH_{2n+1}O)_3B$ (n≦3)) having a boiling point of 55°–56° C., do not provide good solderability because of the high volatility of the methyl borate. In other words, methyl borate in the paste volatilizes and hence does not produce the anti-oxidizing effect, as in the case of preventing copper powder from oxidation by the method disclosed in Japanese Patent Laid-open Publication No. 5-195005.

However, methyl borate gives different results if it is used in the form of a solution in an alcohol having a high boiling point because the solution is less volatile than methyl borate itself. This is true of Samples Nos. 10 to 12 which employ methyl borate in the form of a solution in an alcohol having a high boiling point in an amount equal to or greater than the volume of methyl borate. These samples gave good solderability owing to the reduced volatility.

Samples Nos. 1, 9, and 14 gave good terminal strength but gave poor solderability. Samples Nos. 8, 13, and 21 were poor in both solderability and terminal strength.

The results of thermogravimetry (TG) and differential thermal analysis (DTA) indicate that the boron in tributyl borate vitrifies into $B_2O_3$ at about 200° C., as depicted in FIG. 1. It is this $B_2O_3$ which protects copper powder from the slightly-oxidizing atmosphere during baking for the coating with copper powder.

The same results as mentioned above will be obtained even though the tributyl borate is replaced by a trialkyl borate represented by $(C_nH_{2n+1}O)_3B$ (n≧4) and the methyl borate is replaced by trimethyl borate, triethyl borate or tripropyl borate which are used in combination with an alcohol having a high boiling point to prevent their evaporation. As will be appreciated, the identity of the borate and/or the alcohol are not particularly limited.

The present invention produces the following effects. First, the electrically conductive paste of the present invention is composed of a copper powder, a glass frit, an organic vehicle, and a solution of a borate ester having a high boiling point or a borate ester having a low boiling point in an alcohol having a high boiling point or boric acid, or an organic salt of boron, with the amount of borate or boric acid being about 0.01–0.5 in terms of boron pph copper powder. This process obviates the necessity of dissolving boric acid in a solvent (such as ketone solvent, hydrocarbon solvent, and aromatic solvent), dipping with stirring a copper powder in the solution of boric acid, and drying the treated copper powder for solvent evaporation for protection of copper powder from oxidation, as disclosed in Japanese Patent Laid-open Publication No. 5-195005. This greatly contributes to process streamlining and cost reduction. In addition, the electrically conductive paste provides good solderability and terminal strength.

Second, according to the present invention, it is possible to use a borate ester having a low boiling point if it is dissolved in an alcohol having a high boiling point so as to reduce its volatility.

Third, the tributyl borate (as a butyl ester) has a decomposition temperature of 228° C., which is much higher than that of boric acid simply dissolved in a ketone solvent. Therefore, it forms a boron film which does not prevent the binder from burning and scattering. This is a reason why the electrically conductive paste provides good solderability.

What is claimed is:

1. An electrically conductive paste comprising a copper powder, a glass frit, an organic vehicle, and a solution containing a borate ester, boric acid, an organic salt of boron or combination thereof;

wherein the electrically conductive paste comprises from about 70 to 90 wt % of copper powder and the glass frit in which the ratio of copper powder to glass frit is from about 80:20 to 98:2, and from about 10 to 30 wt % of the organic vehicle and wherein the solution is about 0.01 to 0.5 wt % calculated based on the atomic weight of boron and the combined weight of boron and the copper powder.

2. The electrically conductive paste of claim 1, wherein the solution is a solution of borate ester having a high boiling point.

3. The electrically conductive paste of claim 2, wherein the borate ester having a high boiling point is of the formula $(C_nH_{2n+1}O)_3B$ in which n≧4.

4. The electrically conductive paste of claim 1, wherein the solution is a solution of borate ester having a low boiling point in an alcohol having a high boiling point.

5. The electrically conductive paste of claim 4, wherein the borate ester having a low boiling point is selected from the group consisting of methyl borate, trimethyl borate, triethyl borate, and tripropyl borate.

6. The electrically conductive paste of claim 1, wherein the solution contains an organic salt of boron selected from the group consisting of triethyl boron, dimethylamine borane, and sodium borohydride.

7. A substrate having the electrically conductive paste of claim 1 on a surface thereof.

8. The substrate of claim 7 in which the substrate is an electrical insulator.

9. A method for producing an electrically conductive paste including the step of mixing a copper powder, a glass frit, an organic vehicle, and a solution containing a borate ester, boric acid, an organic salt of boron or combination thereof, wherein the amounts employed are such that there is about 70 to 90 wt % of copper powder and the glass frit in which the ratio of copper powder to glass frit is from about 80:20 to 98:2, and from about 10 to 30 wt % of the organic vehicle and wherein the solution is about 0.01 to 0.5 wt % calculated based on the atomic weight of boron and the combined weight of boron and the copper powder.

10. The method for producing an electrically conductive paste according to claim 9, wherein the solution is a solution of borate ester having a high boiling point.

11. The method of claim 10, wherein the borate ester having a high boiling point is of the formula $(C_nH_{2n+1}O)_3B$ in which $n \geq 4$.

12. The method of claim 9, wherein the solution is a solution of borate ester having a low boiling point in an alcohol having a high boiling point.

13. The method of claim 12, wherein the borate ester having a low boiling point is selected from the group consisting of methyl borate, trimethyl borate, triethyl borate, and tripropyl borate.

14. The method of claim 9, wherein the solution contains an organic salt of boron selected from the group consisting of triethyl boron, dimethylamine borane, and sodium borohydride.

* * * * *